United States Patent
Lee et al.

(10) Patent No.: US 7,705,621 B2
(45) Date of Patent: Apr. 27, 2010

(54) TEST PATTERN AND METHOD OF MONITORING DEFECTS USING THE SAME

(75) Inventors: Hyock-Jun Lee, Incheon (KR); Choel-Hwyi Bae, Suwon-si (KR); Yeong-Lyeol Park, Gyeonggi-do (KR); Nam-Young Lee, Yongin-si (KR); Mi-Joung Lee, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 205 days.

(21) Appl. No.: 11/852,625

(22) Filed: Sep. 10, 2007

(65) Prior Publication Data
US 2008/0084223 A1 Apr. 10, 2008

(30) Foreign Application Priority Data
Sep. 11, 2006 (KR) .................... 10-2006-0087559

(51) Int. Cl.
*G01R 31/26* (2006.01)

(52) U.S. Cl. .......................... 324/765; 324/751; 324/763
(58) Field of Classification Search ...................... None
See application file for complete search history.

(56) References Cited

U.S. PATENT DOCUMENTS

| 6,297,644 | B1 * | 10/2001 | Jarvis et al. | 324/537 |
| 2004/0164755 | A1 * | 8/2004 | Yamaoka et al. | 324/754 |
| 2004/0207414 | A1 * | 10/2004 | Verma et al. | 324/751 |

FOREIGN PATENT DOCUMENTS

| JP | 11-031727 | 2/1999 |
| JP | 2002-368049 | 12/2002 |

* cited by examiner

*Primary Examiner*—Minh N Tang
(74) *Attorney, Agent, or Firm*—F. Chau & Associates, LLC

(57) ABSTRACT

A test pattern includes a normal pattern, an abnormal pattern having predetermined defects, and a conductive line electrically connected to the normal pattern and electrically isolated from the abnormal pattern. Thus, a non-contact test process and a contact test process may be compatible with the single test pattern.

7 Claims, 7 Drawing Sheets

TEST PATTERN AND METHOD OF MONITORING DEFECTS USING THE SAME

CROSS-REFERENCE TO RELATED APPLICATION

This application claims priority under 35 USC § 119 to Korean Patent Application No. 2006-87559 filed on Sep. 11, 2006, the contents of which are herein incorporated by reference in their entirety.

BACKGROUND OF THE INVENTION

1. Technical Field

Exemplary embodiments of the present invention relate to a test pattern and a method of monitoring defects using the same. More particularly, exemplary embodiments of the present invention relate to a test pattern that is used for setting examination procedures in a tester for detecting defects of a semiconductor device, and a method of monitoring the defects using the test pattern.

2. Discussion of Related Art

Generally, a semiconductor device may be manufactured by various processes, such as a deposition process, a photolithography process, an ion implantation process, a polishing process, a cleaning process, and the like. After completing one or more of the above-mentioned processes, a plurality of defects, such as a short, an open, and the like, may be generated in the semiconductor device. The defects may have undesirable effects on the performance of the semiconductor device. Thus, to effectively control the defects that may be generated in each of the processes, the defects need to be detected using a suitable defect detector.

Further, to determine whether the defect detector has the desired detection capacities, the detection capacities of the defect detector may be examined using a test pattern. Here, the methods used for a defect detector examination may be classified into a non-contact test process and a contact test process using a probe.

Examples of conventional methods used for the defect detector examination are disclosed in U.S. Patent Application Publication No. 2004-207414 and Japanese Patent Laid-Open Publication Nos. 2002-368049 and 1999-31727.

According to the non-contact test process, a test pattern is scanned using an electron beam. Defects in the test pattern are then detected based on the obtained scanning results.

In contrast, according to the contact test process, the probe electrically makes contact with a test pattern. An electrical signal is supplied to the test pattern through the probe. Defects in the test pattern are then detected according to the obtained electrical signals.

To enhance the accuracy in examining the detection capacity of the defect detector, a method of artificially forming and implanting defects into a test pattern has been used. For instance, defects are artificially formed in a specific portion of the test pattern, and then the detection capacity of the defection tester is examined by accurately detecting an abnormal pattern therein that has defects detected by the defect detector.

When the non-contact test process is employed, the artificially created defects may be precisely detected based on a brightness difference between a normal pattern and the abnormal pattern on the obtained scanning result. When the contact test process is employed, however, all patterns in the test pattern may be detected as abnormal patterns, because the probe makes contact with the all of the patterns. That is, since the normal pattern and the abnormal pattern in the conventional test pattern are electrically connected to each other, all of the patterns may be determined as abnormal patterns when the contact test process is performed. As a result, when the contact test process is employed, the defects may not be artificially formed in the conventional test pattern. Therefore, it may be required to prepare separate test patterns in accordance with the contact test process and the non-contact test process.

Further, since the non-contact test process and the contact test process may not be applied to the conventional single test pattern, defects between a pattern and a conductive line arranged on the pattern may not be accurately detected. For example, in the conventional single test pattern, when a pattern is formed by a chemical mechanical polishing (CMP) process, minute conductive materials may still remain between the patterns. Thus, after forming the pattern, it may be necessary to perform a subsequent process so as to carry out the defect detection process. As a result, after the conductive line is formed on the pattern by the subsequent process, the defect detection process is carried out using the conductive line. Here, since the pattern is covered with the conductive line, defects such as the minute conductive materials may be detected only by the contact test process, but not by the non-contact test process. As described above, however, the contact test process and the non-contact test process may not be applied to the conventional test pattern so that defects between the pattern and the conductive line may not be accurately detected.

Furthermore, in a conventional test pattern having alternately arranged patterns such as an NMOS contact and a PMOS contact, that have different electrical characteristics, the two kinds of the patterns may be separately scanned with an electron beam during the non-contact test process. Thus, separate information with respect to each of the patterns may not be obtained, because the electron beam may have a minimum scan width of about 100 μm, and each of the patterns may have a width of no more than about 50 μm. Therefore, patterns having different electrical characteristics may not be separately tested using the conventional test pattern.

SUMMARY OF THE INVENTION

Exemplary embodiments of the present invention provide a test pattern that is compatible with both a non-contact test process and a contact test process.

Exemplary embodiments of the present invention provide a method of monitoring defects using the above-mentioned test pattern.

A test pattern in accordance with an exemplar embodiment of the present invention includes a normal pattern, an abnormal pattern having defects, and a conductive line electrically connected to the normal pattern and electrically separated from the abnormal pattern.

According to an exemplary embodiment of the present invention, the normal pattern may include first patterns arranged in parallel with one another to be electrically connected to the conductive line, and second patterns arranged between the first patterns and respectively connected to ground. Further, the second patterns may be connected to a single ground. Furthermore, the first patterns and the second patterns may be connected to a plurality of grounds respectively.

According to an exemplary embodiment of the present invention, the defects may include a bridge connecting the first and the second patterns that are adjacent each other. The abnormal pattern may include the first pattern having the bridge. Alternatively, each of the defects may include a cut portion formed at any one of the second patterns. The abnormal pattern may include a second pattern having the cut portion.

According to an exemplary embodiment of the present invention, the test pattern may further include a pad connected to the conductive line to apply a voltage to the normal pattern.

In a method of monitoring defects in accordance with an exemplary embodiment of the present invention, normal patterns are formed on a substrate. A first defect is formed at any one of the first patterns to form an abnormal pattern having the first defect. The normal pattern and the abnormal pattern are then tested by a non-contact test process to obtain first information with respect to the first defect. An insulation interlayer is formed on the normal pattern and the abnormal pattern. In this exemplary embodiment, the insulation interlayer has a first contact hole for partially exposing the normal pattern, and a second contact hole for partially exposing the abnormal pattern. A conductive line having a contact is then formed on the insulation interlayer to fill up the first contact hole with the contact. The contact is tested by a contact test process to obtain second information with respect to a second defect between the normal pattern and the conductive line.

According to an exemplary embodiment of the present invention, the non-contact test process may include scanning the normal pattern and the abnormal pattern by using an electron beam. Further, the contact test process may include contacting a probe to the contact.

According to an exemplary embodiment of the present invention, the method may further include forming a pad for applying a voltage to the normal pattern through the conductive line.

A test pattern in accordance with an exemplary embodiment of the present invention includes a first pattern having a first electrical characteristic, a second pattern having a second electrical characteristic that is different from the first electrical characteristic, and a test line extending from the first pattern.

According to an exemplary embodiment of the present invention, the first pattern and the second pattern may be alternately arranged.

In a method of monitoring defects in accordance with an exemplary embodiment of the present invention, a first pattern having a first electrical characteristic, and a second pattern having a second electrical characteristic that is different from the first electrical characteristic are formed on a substrate. A test line extends from the first pattern. The test line is tested by a non-contact test process to obtain first information with respect to a defect in the first pattern. The first and the second patterns are then tested by a non-contact test process to obtain second information with respect to all defects in the first and the second patterns. The first information is excluded from the second information to obtain third information with respect to a defect only in the second pattern.

According to an exemplary embodiment of the present invention the method may further include artificially forming defects in the first pattern and/or the second pattern.

According to an exemplary embodiment of the present invention, the abnormal pattern having the defect is electrically separated from the conductive line so that errors of the contact test process may not occur. More specifically, because the pattern as a lower layer is tested by the non-contact test process and the conductive line as an upper layer is tested by the contact test process, defects between the upper layer and the lower layer may be accurately detected. Further, the alternately arranged patterns having different electrical characteristics may be precisely tested by the non-Contact test process.

BRIEF DESCRIPTION OF THE DRAWINGS

Exemplary embodiments of the present invention will be understood in more detail from the following descriptions taken in conjunction with the accompanying drawings wherein.

DESCRIPTION OF EXEMPLARY EMBODIMENTS

Exemplary embodiments of the present invention are described more fully hereinafter with reference to the accompanying drawings, in which exemplary embodiments of the invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art.

Figure 1:
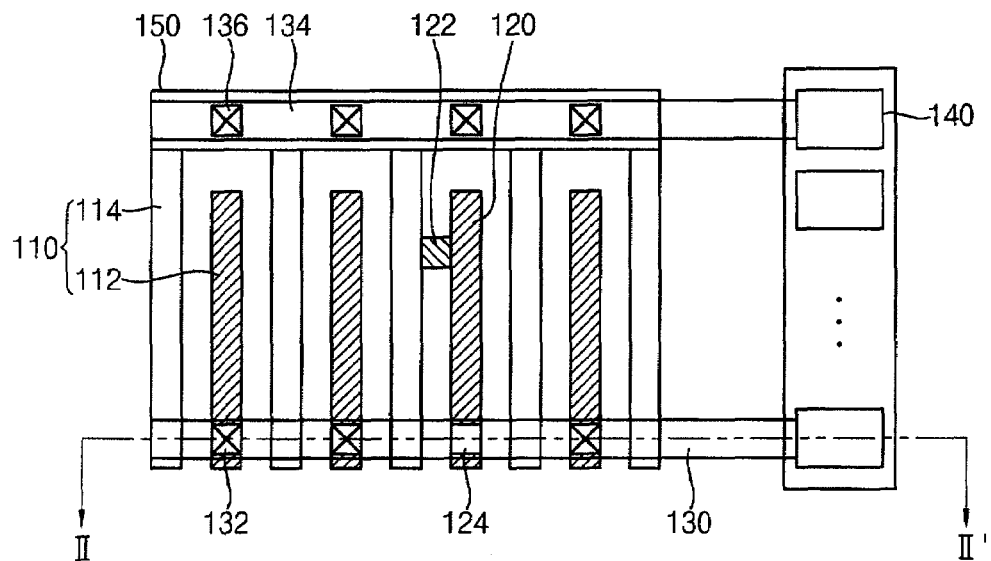
FIG. 1 is a plan view illustrating a test pattern in accordance with an exemplary embodiment of the present invention.
Figure 2:
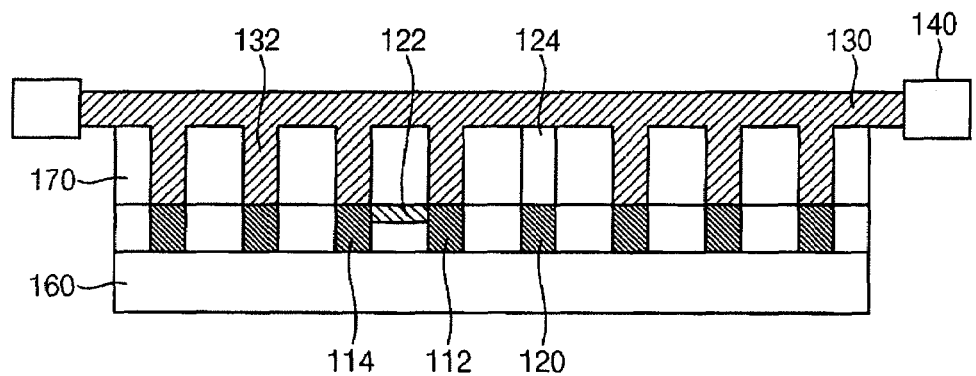
FIG. 2 is a cross-sectional view taken along line II-II' in FIG. 1.

FIG. 1 is a plan view illustrating a test pattern in accordance with an exemplary embodiment of the present invention, and FIG. 2 is a cross-sectional view taken along line II-II' in FIG. 1.

Referring to FIGS. 1 and 2, a test pattern includes a normal pattern 110, an abnormal pattern 120, a first conductive line 130, a pad 140 and a ground 150.

The normal pattern 110 includes first patterns 112 and second patterns 114 formed on a semiconductor substrate 160. The first patterns 112 have linear shapes and are arranged in parallel with one another. Further, the second patterns 114 also have linear shapes and are arranged in parallel with one another. More specifically, the second patterns 114 are arranged between the first patterns 112. That is, the first patterns 112 and the second patterns 114 are alternately arranged.

The abnormal pattern 120 corresponds to any one of the first patterns 112. In this exemplary embodiment, defects are artificially formed at any one of the first patterns 112 to convert the first pattern 112 into the abnormal first pattern 120. In this exemplary embodiment of the present invention, the defect is a bridge 122 that connects the abnormal pattern 120 to the second pattern 114 adjacent the abnormal pattern 120. As a result, a short between the second pattern 114 and the abnormal pattern 120 is formed through the bridge 122. Alternatively, the bridge 122 may be formed at the second pattern 114.

The first conductive line 130 is formed on first ends of the normal pattern 110 and the abnormal pattern 120. The first conductive line 130 is electrically connected to the first ends of the first patterns 112 through contacts 132. In contrast, the contact 132 is not arranged between the first conductive line 130 and the abnormal pattern 120. That is, a non-contact portion 124 is formed between the first conductive line 130 and the abnormal pattern 120, so that the first conductive line 130 and the abnormal pattern 120 are electrically isolated from each other. In this exemplary embodiment, the non-contact portion 124 corresponds to a contact hole that is formed by removing the contact 132. The contact hole 124 may be formed through an insulation interlayer 170 between the normal pattern 110 and the first conductive line 130. Probes (not shown) used for a contact test process may make contact with the contacts 132.

Second ends of the second pattern 114 opposite to the first ends thereof are connected to the single ground 150. Thus, the abnormal pattern 120 connected to the second pattern 114 through the bridge 122 is also connected to the ground 150.

Additionally, a second conductive line 134 is formed over the ground 150. The second conductive line 134 is electrically connected to the pad 140 through the contacts 136.

The first conductive line 130 and the second conductive line 134 are connected to the pads 140 respectively. In this exemplary embodiment, the pads 140 may be used for applying a voltage to the normal pattern 110 through the first conductive line 130 and the second conductive line 134.

Figure 3:
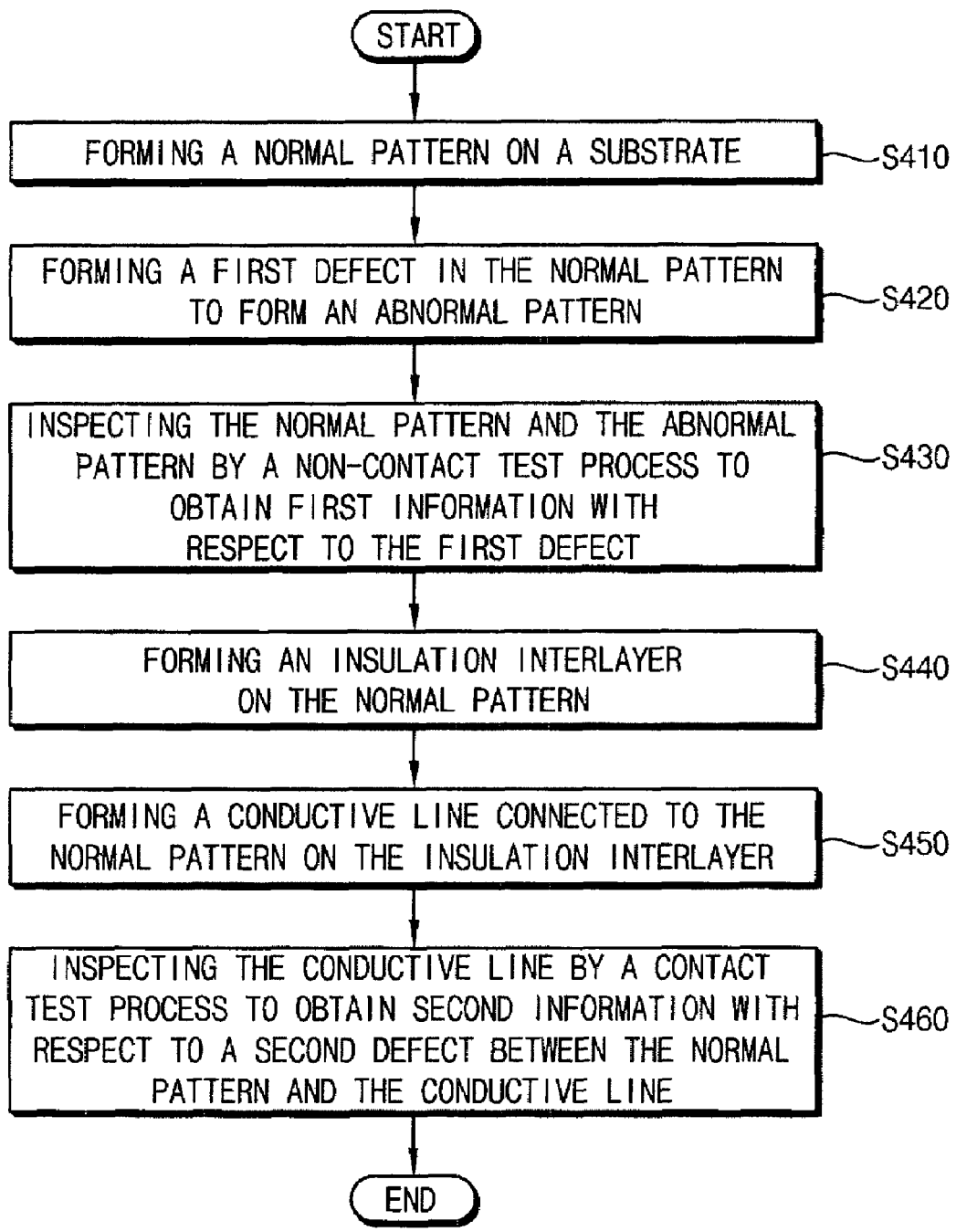
FIG. 3 is a flow chart illustrating a method of monitoring defects using the test pattern in FIG. 1.

FIG. 3 is a flow chart illustrating a method of monitoring defects using the test pattern shown in FIG. 1.

Referring to FIGS. 1 to 3, in step S410, the normal pattern 110 including the first patterns 112 and the second patterns 114 is formed on the semiconductor substrate 160. In this exemplary embodiment, the first patterns 112 and the second patterns 114 may include a conductive material such as metal. The second patterns 114 are then connected to the ground 150.

In step S420, a first defect is artificially formed at the first pattern 112 of the normal pattern 110 to convert the normal first pattern 112 into the abnormal first pattern 120. In this exemplary embodiment, the bridge 122 as the first defect is formed between the first and second patterns 112 and 114 that are adjacent each other in order to artificially form the abnormal first pattern 120. Therefore, an electrical short is generated between the second pattern 114 and the abnormal pattern 120.

In step S430, the normal pattern 110 and the abnormal first pattern 120 are tested by a noncontact test process to obtain first information with respect to the bridge 122. In this exemplary embodiment of the present invention, a voltage is applied to the normal pattern 110. The normal pattern 110 and the abnormal first pattern 120 are scanned by using an electron beam to obtain an image with respect to the normal pattern 110 and the abnormal first pattern 120. In this exemplary embodiment, the second patterns 114 and the abnormal first pattern 120 are connected to the ground 150, while the first patterns 112 are not connected to the ground 150. Thus, the first patterns 112 may be displayed as a shadow region on the image. In contrast, the second patterns 114 and the abnormal first pattern 120 may be brightly displayed on the image. The image represents the bridge 122 as the first defect on the abnormal first pattern 120 that corresponds to any one of the first patterns 112.

In step S440, the insulation interlayer 170 is formed on the normal pattern 110. In this exemplary embodiment of the present invention, the insulation interlayer 170 may have contact holes 124 for partially exposing the normal pattern 110 and the abnormal first pattern 120. More specifically, a photoresist pattern (not shown) is formed on the insulation interlayer 170. The insulation interlayer 170 is etched using the photoresist pattern as an etching mask to form the contact hole 124 that partially exposes the normal pattern 110 and the abnormal first pattern 120.

In step S450, a metal layer (not shown) is formed on the insulation interlayer 170 to fill the contact hole 124 with the metal layer. The metal layer is then patterned to form contacts 132 in the contact holes 124 and form the first and the second conductive lines 130 and 134 on the insulation interlayer 170. The contacts 132 formed only on the abnormal pattern 120 are removed to electrically isolate the abnormal first pattern 120 from the first conductive line 130. Alternatively, when forming the metal layer, the metal layer may not be formed in the contact holes 124 so as to expose the abnormal first pattern 120.

In step S460, the first conductive line 130 is tested by a contact test process to obtain second information with respect to a second defect between the normal pattern 110 and the first conductive line 130. In this exemplary embodiment, a voltage is applied to the first conductive line 130 and the second conductive line 134 through the pads 140. The probes make contact with the contacts 132 to receive electrical signals from the normal pattern 110 and the abnormal first pattern 120.

In this exemplary embodiment, because the abnormal first pattern 120 is not connected to the first conductive line 130, the electrical signal from the abnormal first pattern 120 will not be received. As a result, when a defect is monitored by the contact test process, the normal pattern 110 may not be detected as being abnormal due to the bridge 122. Further, when other defects except for the first defect do not exist in the normal pattern 110, the received electrical signals will represent the normal pattern 110 as a normal state. In contrast, when the received electrical signals may be different from a predetermined normal signal, this may represent that a second defect is generated between the normal pattern 110 and the first conductive line 130.

According to this exemplary embodiment of the present invention, the abnormal pattern having the artificial defects is electrically isolated from the conductive line. Thus, defect-monitoring results obtained by performing the contact test process may be accurate. As a result, the contact test process together with the non-contact process may be applied to the single test pattern to thereby monitor the defects.

Figure 4:
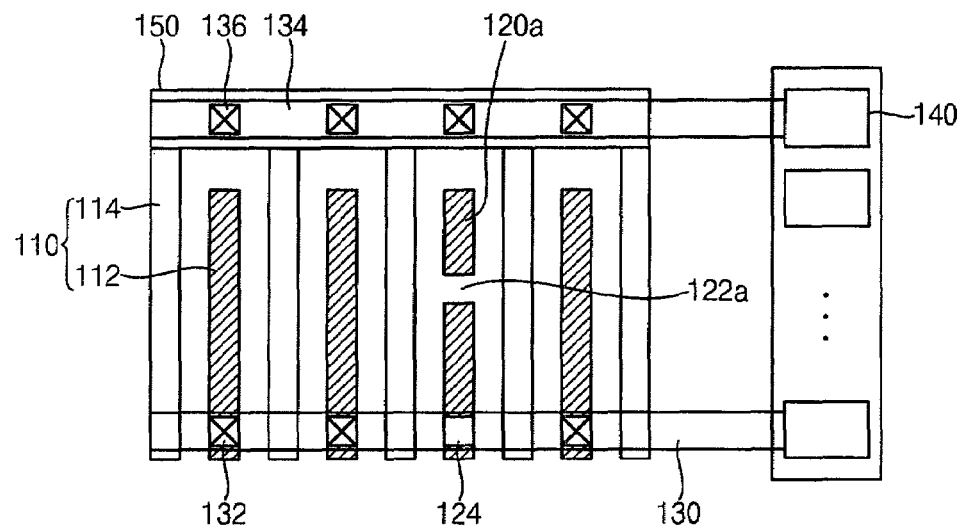
FIG. 4 is a plan view illustrating a test pattern in accordance with an exemplary embodiment of the present invention.

FIG. 4 is a plan view illustrating a test pattern in accordance with an exemplary embodiment of the present invention.

A test pattern of this exemplary embodiment includes the same elements of the test pattern shown in FIG. 1 except for the defect shown therein. Thus, the same reference numerals refer to the same elements and any further illustrations with respect to the same elements are omitted herein for brevity.

Referring to FIG. 4A the test pattern 100a has a cut portion 122a as the defect. The cut portion 122a is formed at the first pattern 112 of the normal pattern 110 to divide the first pattern 112 into two portions electrically separated from each other. Thus, a current may not flow through the abnormal first pattern 120a having the cut portion 122a. Alternatively, the cut portion 122a may be formed at the second pattern 114.

Further, to cut off supply of the current into the abnormal first pattern 120a when detecting defects by the contact test process, the abnormal first pattern 120a is electrically isolated from the first conductive line 130.

In this exemplary embodiment, a method of monitoring defects by using the above-mentioned test pattern 100a is substantially the same as that illustrated FIG. 3. Thus, any further illustrations with respect to the method of this exemplary embodiment are omitted herein for brevity.

Figure 5:
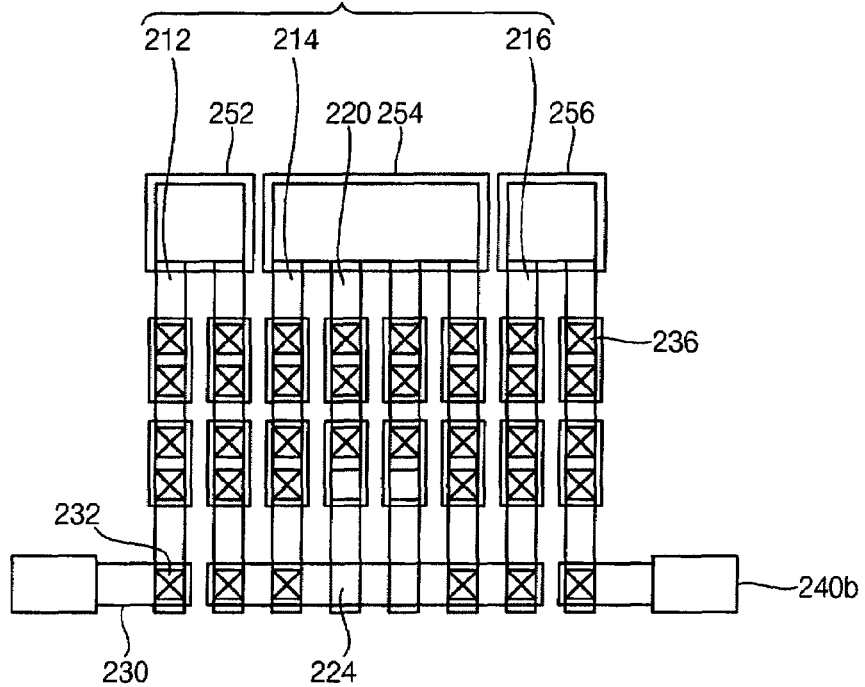
FIG. 5 is a plan view illustrating a test pattern in accordance with an exemplary embodiment of the present invention.

FIG. 5 is a plan view illustrating a test pattern in accordance with an exemplary embodiment of the present invention.

Referring to FIG. 5, a test pattern 200 includes a normal pattern 210, an abnormal pattern 220, a conductive line 230, a pad 240, a first ground 252, a second ground 254 and a third ground 256.

The normal pattern 210 includes a first pattern 212, a second pattern 214 and a third pattern 216. The first pattern 212, the second pattern 214 and the third pattern 216 have linear shapes arranged in parallel with one another. The first pattern 212, the second pattern 214 and the third pattern 216 are not directly connected to one another. The first pattern 212, the second pattern 214 and the third pattern 216 have the linear shapes connected to one another through a plurality of contacts 236.

In this exemplary embodiment of the present invention, ends of the first pattern 212, the second pattern 214 and the third pattern 216 are grounded. More specifically, the first pattern 212 is connected to the first ground 252, the second pattern 214 is connected to the second ground 254, and the third pattern 216 is connected to the third ground 256. That is, the first pattern 212, the second pattern 214 and the third pattern 216 are respectively connected to the first ground 252, the second ground 254 and the third ground 256.

The contact 236 between the second patterns 214 is removed to form the abnormal pattern 220 that is electrically isolated from the second pattern 214.

The conductive line 230 is connected to the pad 240. The conductive line 230 is formed on ends of the normal pattern 210 and the abnormal pattern 220. The conductive line 230 is electrically connected to the end of the normal pattern 210 through the contact 232. In contrast the contact 232 is not arranged between the conductive line 230 and the abnormal pattern 220 so that the abnormal pattern 220 is electrically isolated from the conductive line 230.

In this exemplary embodiment, a method of monitoring defects using the above-mentioned test pattern 200 is substantially the same as that illustrated in FIG. 3. Thus, any further explanations with respect to the method of this exemplary embodiment are omitted herein for brevity.

Figure 6:
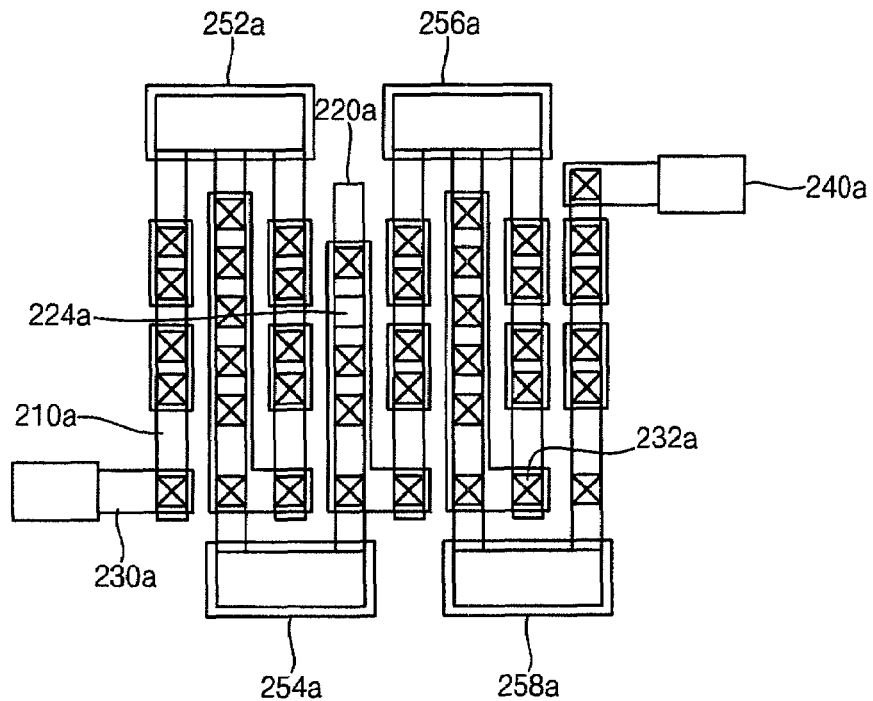
FIG. 6 is a plan view illustrating a test pattern in accordance with an exemplary embodiment of the present invention.

FIG. 6 is a plan view illustrating a test pattern in accordance with an exemplary embodiment of the present invention.

A test pattern of this exemplary embodiment includes the same elements of the test pattern shown in FIG. 5, except for a normal pattern and a ground. Thus, the same reference numerals refer to the same elements and any further explanations with respect to the same elements are omitted herein for brevity.

Referring to FIG. 6, a test pattern 200a includes a normal pattern 210a, an abnormal pattern 220a, a conductive line 230a, a pad 240a, a first ground 252a, a second ground 254a, a third ground 256a, and a fourth ground 258a.

The normal pattern 210a has linear shapes arranged in parallel with one another. The first ground 252a and the third ground 256a are positioned adjacent a first end of the normal pattern 210a. The second ground 254a and the fourth ground 258a are located adjacent a second end of the normal pattern 210a opposite to the first end. Odd lines of the normal pattern 210a are connected to the first ground 252a and the third ground 256a, respectively. In contrast, even lines of the normal pattern 210a are connected to the second ground 254a and the fourth ground 258a.

A contact 224a on a fourth line of the normal pattern 210a is removed to form the abnormal pattern 220a. Because it is the fourth line of the normal pattern 210a, the abnormal pattern 220a is connected to the second ground 254a. Because the contact 224a between the abnormal pattern 220a and the second ground 254a is removed, however, the abnormal pattern 220a is electrically isolated from the second ground 254a.

In this exemplary embodiment, a method of monitoring defects using the above-mentioned test pattern 200a is substantially the same as that illustrated in FIG. 3. Thus, any further explanations with respect to the method of this exemplary embodiment are omitted herein for brevity.

Figure 7:
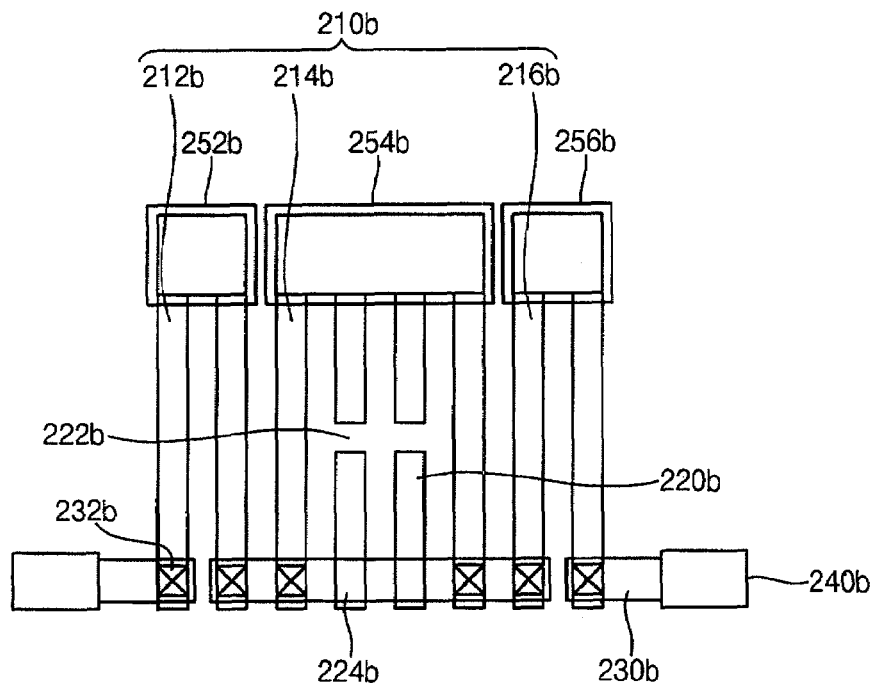
FIG. 7 is a plan view illustrating a test pattern in accordance with an exemplary embodiment of the present invention.

FIG. 7 is a plan view illustrating a test pattern in accordance with an exemplary embodiment of the present invention.

Referring to FIG. 7, a test pattern 200b includes a normal pattern 210b, an abnormal pattern 220b, a conductive line 230b, a pad 240b, a first ground 252b, a second ground 254b and a third ground 256b.

The normal pattern 210b includes a first pattern 212b, a second pattern 214b and a third pattern 216b. The first pattern 212b, the second pattern 214b and the third pattern 216b have linear shapes arranged in parallel with one another.

In this exemplary embodiment of the present invention, ends of the first pattern 212b, the second pattern 214b, and the third pattern 210b are grounded. More specifically the first pattern 212b is connected to the first ground 252b. The second pattern 214b is connected to the second ground 254b. The third pattern 216b is connected to the third ground 250b. That is, the first pattern 212b, the second pattern 214b and the third pattern 216b are respectively connected to the first ground 252b, the second ground 254b, and the third ground 256b.

A cut portion 222b is formed between the second patterns 214b to form the abnormal pattern 220b having the cut portion 222b. Thus, the abnormal pattern 220b is not connected to the second ground 254b.

The conductive line 230b is connected to the pad 240b and the conductive line 230b is formed on ends of the normal pattern 210b and the abnormal pattern 220b. The conductive line 230b is electrically connected to the ends of the normal pattern 210b through contacts 232b. In contrast, the contact 232b is not arranged between the conductive line 230b and the abnormal pattern 220b, so that the abnormal pattern 220b is electrically isolated from the conductive line 230b.

In this exemplary embodiment, a method of monitoring defects using the above-mentioned test pattern 200b is substantially the same as that illustrated in FIG. 3. Thus, any further explanations with respect to the method of this exemplary embodiment are omitted herein for brevity.

Figure 8:
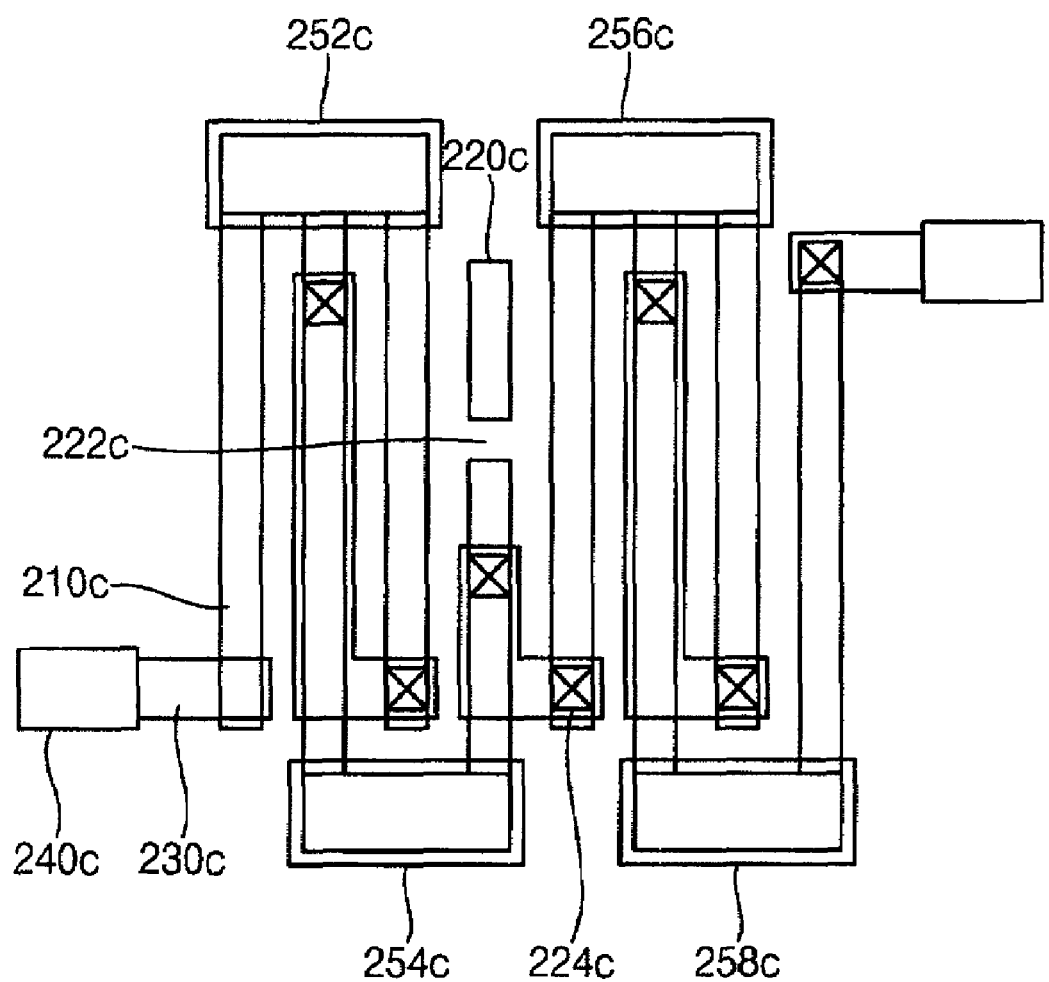
FIG. 8 is a plan view illustrating a test pattern in accordance with an exemplary embodiment of the present invention.

FIG. 8 is a plan view illustrating a test pattern in accordance with an exemplary embodiment of the present invention.

A test pattern of this exemplary embodiment includes the same elements of the test pattern shown in FIG. 7, except for a normal pattern and a ground. Thus, the same reference numerals refer to the same elements and any further illustrations with respect to the same elements are omitted herein for brevity.

Referring to FIG. 8, a test pattern 200c includes a normal pattern 210c, an abnormal pattern 220c, a conductive line 230c, a pad 240c, a first ground 252c, a second ground 254c, a third ground 256c, and a fourth ground 258c.

The normal pattern 210c has linear shapes arranged in parallel with one another. The first ground 252c and the third ground 256c are positioned adjacent first ends of the normal pattern 210c. The second ground 254c and the fourth ground 258c are located adjacent second ends of the normal pattern 210c opposite to the first end. Odd lines of the normal pattern 210c are connected to the first ground 252c and the third ground 256c. In contrast, even lines of the normal pattern 210c are connected to the second ground 254c and the fourth ground 258c.

A cut portion 222c is formed at a fourth line of the normal pattern 210c to form the abnormal pattern 220c. Thus, the abnormal pattern 220c is connected to the second ground 254c. Because a contact 232c between the abnormal pattern 220c and the second ground 254c is removed, the abnormal pattern 220c is electrically isolated from the second ground 254c.

In this exemplary embodiment, a method of monitoring defects using the above-mentioned test pattern 200c is substantially the same as that illustrated in FIG. 3. Thus, any further explanations with respect to the method of this exemplary embodiment are omitted herein for brevity.

Figure 9:
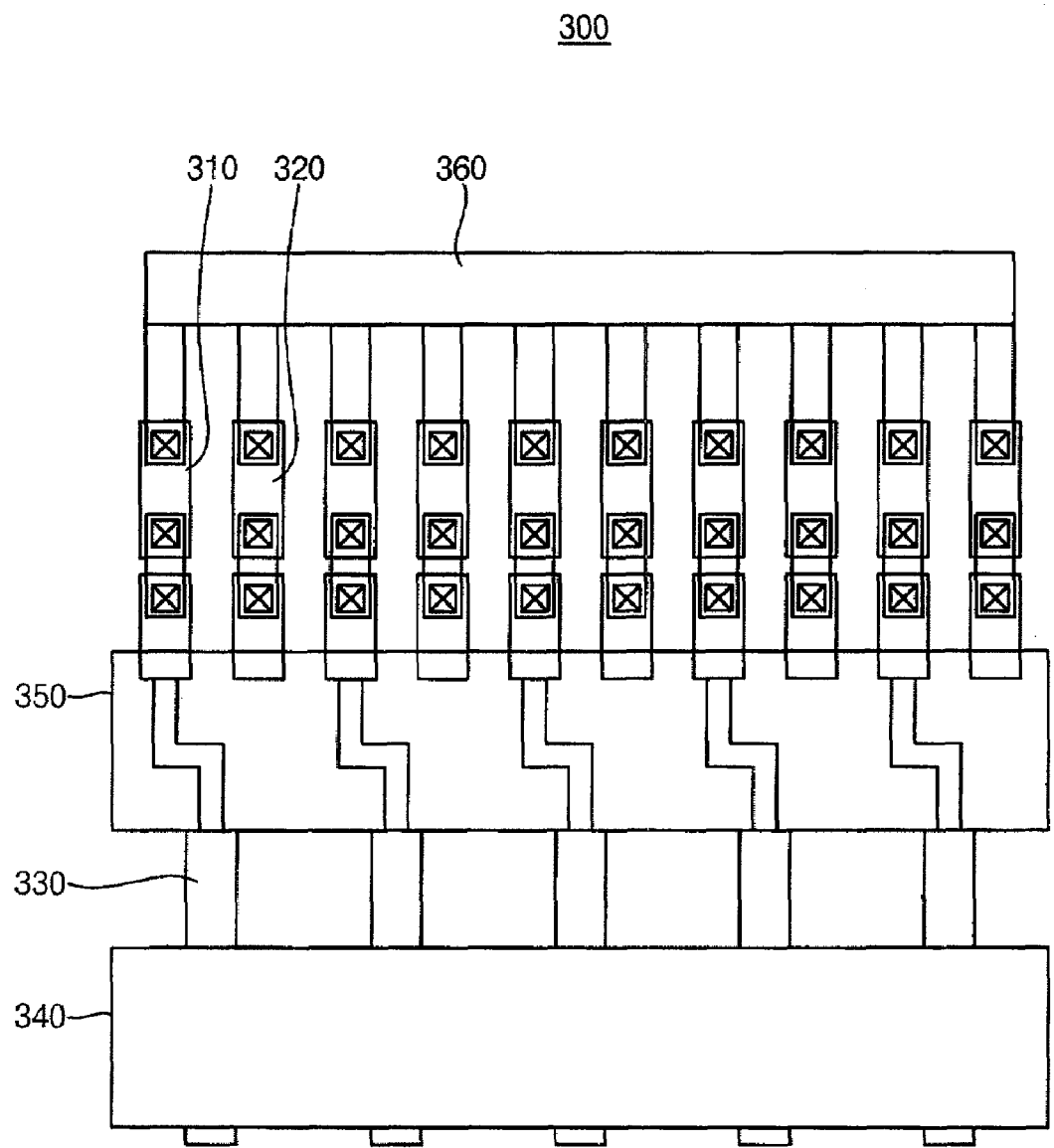
FIG. 9 is a plan view illustrating a test pattern in accordance with an exemplary embodiment of the present invention.

FIG. 9 is a plan view illustrating a test pattern in accordance with an exemplary embodiment of the present invention.

Referring to FIG. 9, a test pattern 300 includes a first pattern 310, a second pattern 320, a test line 330 and a ground 360.

The first pattern 310 has a first electrical characteristic. In contrast, the second pattern 320 has a second electrical characteristic different from the first electrical characteristic. In this exemplary embodiment, the first pattern 310 may include an NMOS contact, and the second pattern 320 may include a PMOS contact. Further, the first pattern 310 and the second pattern 320 are alternately arranged in parallel with each other, and the first pattern 310 and the second pattern 320 are each connected to the ground 360.

In this exemplary embodiment, the alternately arranged first and second patterns 310 and 320 may not be independently scanned by an electron beam, because the electron beam may have a width smaller than the widths of the first and the second patterns 310 and 320. That is, separate information with respect to the first pattern 310 and the second pattern 320 having the different electrical characteristics may not be obtained.

According to this exemplary embodiment, however, in order to monitor only defects in the first pattern 310, the test line 330 extends from the first pattern 310 toward a direction opposite to the ground 360. In this exemplary embodiment, when the test line 330 has a narrow width, native defects in the test lines 330 may be detected based on an image obtained by scanning the first pattern with the electron beam. To exclude the native defect from the test line 330, the test line 330 may have a width of no less than about two times a design limit of the first pattern 310.

Therefore, a first region 340, which covers the test lines 330, corresponds to a primary scan area. Further, a second region 350 covering the first pattern 310 and the second pattern 320 corresponds to a secondary scan area.

Figure 10:
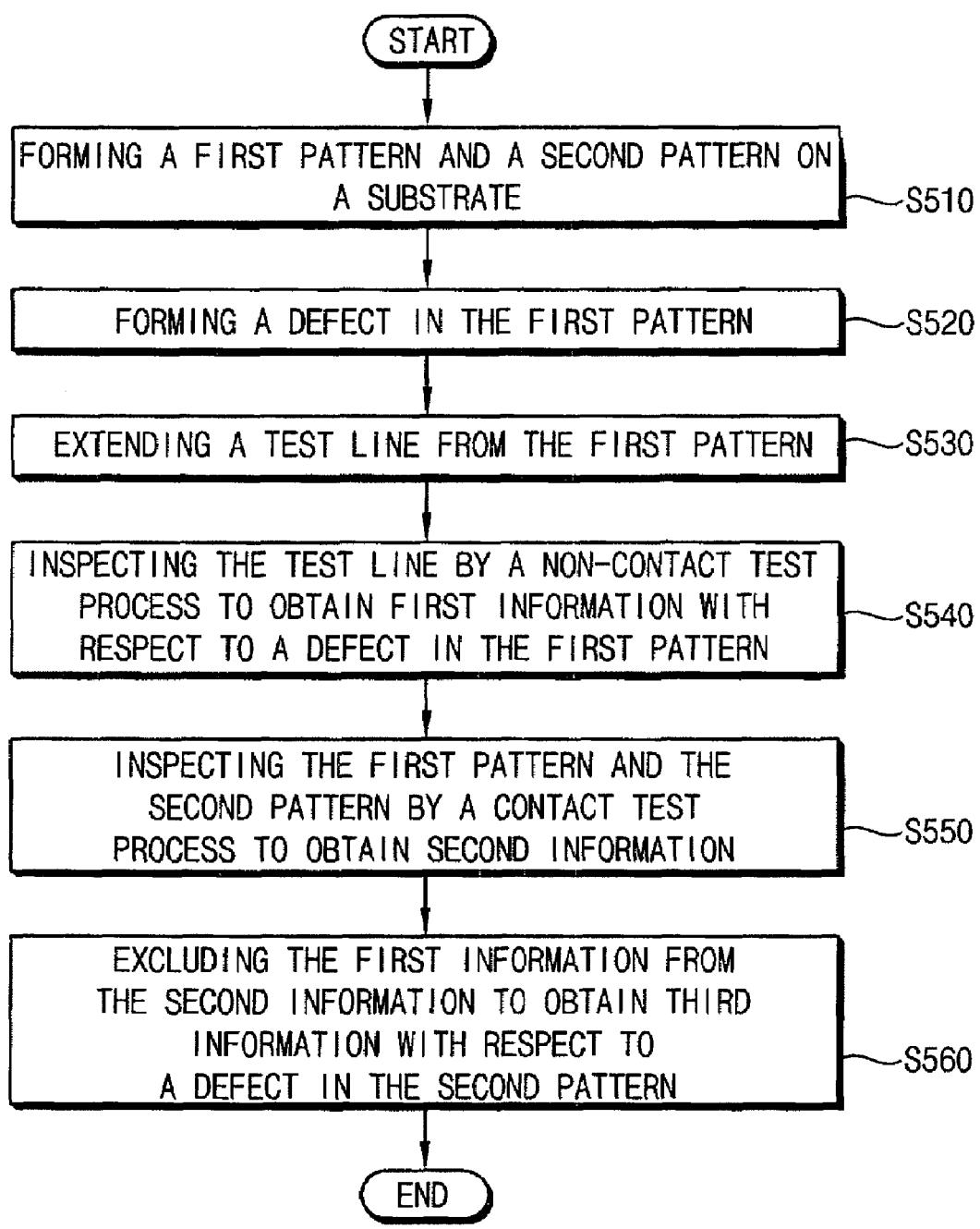
FIG. 10 is a flow chart illustrating a method of monitoring defects using the test pattern shown in FIG. 9.

FIG. 10 is a flow chart illustrating a method of monitoring defects using the test pattern shown in FIG. 9.

Referring to FIGS. 9 and 10, in step S510, the first pattern 310 and the second pattern 320 are formed on a semiconductor substrate (not shown). In this exemplary embodiment, the first pattern 310 may include an NMOS contact having a first electrical characteristic, and the second pattern may include a PMOS contact having a second electrical characteristic that is different from the first electrical characteristic. Further, the first pattern 310 and the second pattern 320 are alternately arranged in parallel with each other.

In step S520, defects, such as a bridge, a cut portion, and the likes are artificially formed at the first pattern 310. Alternatively, the defects may be formed at the second pattern 320. Here, the artificial defect formation may not be necessarily required in this exemplary embodiment. Therefore, the method of this example embodiment need not include artificially forming the defects.

In step S530, the test line 330 extends from the first pattern 310. In this case, to prevent the native defects of the test line 330 from being detected due to a narrow width of the test line 330, the test line 330 may have a width of no less than about two times a design limit of the first pattern 310.

In step S540, only the test line 330 is primarily scanned to obtain a first image with respect to the test line 330. In this exemplary embodiment, the first region 340 covering the test line 330 is scanned by using an electron beam to obtain the first image. In this exemplary embodiment, because the test line 330 is connected only to the first pattern 310, the obtained first image may include information such as a number of the defects, defect density, and the like, with respect to the defect in the first pattern 310.

In step S550, the first pattern 310 and the second pattern 320 are secondarily scanned to obtain a second image with respect the first pattern 310 and the second pattern 320. In this exemplary embodiment, the second region 350 covering the first pattern 310 and the second pattern 320 is scanned using an electron beam to obtain the second image. In this case, the obtained second image may include information on all defects in the first pattern 310, as well as in the second pattern 320.

In step S560, the first information is excluded from the second information to obtain third information. In this exemplary embodiment, because the third information does not include the first information with respect to the defect in the first pattern 310, the third information includes only information with respect to a defect in the second pattern 320.

Therefore, the defect-monitoring process with respect to the first pattern and the second pattern that have different electrical characteristics may be accurately carried out by scanning twice using the test lines 330.

According to exemplary embodiments of the present invention, the abnormal pattern having the defect is electrically isolated from the conductive line so that the contact test process may be prevented from malfunctioning. More specifically, because the pattern as a lower layer is tested by the non-contact test process and the conductive line as an upper layer is tested by the contact test process, defects between the upper layer and the lower layer may be accurately detected. Further, the alternately arranged patterns that have different electrical characteristics may be precisely examined by the noncontact test process.

Having described exemplary embodiments of the present invention, it is noted that modifications and variations can be made by persons skilled in the art in light of the above teachings. It is therefore to be understood that changes may be made in the exemplary embodiment of the present invention as disclosed, which are within the scope and the spirit of the invention outlined by the appended claims.

What is claimed is:

1. A method of monitoring defects, comprising:
    forming normal patterns on a substrate;
    artificially forming a first defect at any one of the first patterns to form an abnormal pattern;
    examining the normal patterns and the abnormal pattern by a non-contact test process to obtain first information with respect to the first defect;
    forming an insulation interlayer on the normal pattern and the abnormal pattern, the insulation interlayer having a first contact hole that partially exposes the normal pattern and a second contact hole that partially exposes the abnormal pattern;

forming a conductive line on the insulation interlayer, the conductive line having a contact that fully fills up the first contact hole; and examining the contact by a contact test process to obtain second information with respect to a second defect between the normal pattern and the conductive line.

2. The method of claim 1, wherein forming the normal pattern comprises:

forming first patterns on the substrate in parallel;
forming second patterns between the first patterns; and
grounding the second patterns.

3. The method of claim 2, wherein grounding the second patterns comprises connecting the second patterns to a single ground.

4. The method of claim 1, wherein forming the first defect comprises forming a bridge between adjacent normal patterns to electrically connect the adjacent normal patterns to each other.

5. The method of claim 1, wherein the non-contact test process comprises scanning the normal pattern and the abnormal pattern by using an electron beam.

6. The method of claim 1, wherein the contact test process comprises contacting a probe to the contact.

7. The method of claim 1, further comprising forming a pad for applying a voltage to the normal pattern through the conductive line.

* * * * *